United States Patent
Iwata et al.

(10) Patent No.: US 6,803,075 B2
(45) Date of Patent: Oct. 12, 2004

(54) METHOD EMPLOYING PLURALITY OF PARTICLES AND PRESSURE DIFFERENTIALS TO DEPOSIT FILM

(75) Inventors: Kenichi Iwata, Tokyo (JP); Yoshikatsu Okada, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/379,509

(22) Filed: Mar. 6, 2003

(65) Prior Publication Data
US 2003/0198744 A1 Oct. 23, 2003

(30) Foreign Application Priority Data
Apr. 23, 2002 (JP) ........................................ 2002-120754

(51) Int. Cl.⁷ .............................................. C23C 16/04
(52) U.S. Cl. ............... 427/248.1; 427/250; 427/255.23; 427/256; 134/21; 134/31
(58) Field of Search ......................... 427/248.1, 255.23, 427/250, 256; 134/21, 31

(56) References Cited

U.S. PATENT DOCUMENTS

| | | | |
|---|---|---|---|
| 5,186,120 A | * | 2/1993 | Ohnishi et al. ............. 118/667 |
| 6,383,050 B1 | | 5/2002 | Ishikura et al. ............... 445/41 |

FOREIGN PATENT DOCUMENTS

| | | | |
|---|---|---|---|
| EP | 1020889 | 7/2000 | |
| JP | 2-16379 | 4/1990 | |
| JP | 5-136128 | 6/1993 | |
| JP | 05136128 A | * 6/1993 | ....... H01L/21/3205 |
| JP | 7-96260 | 4/1995 | |
| JP | 07096260 A | * 4/1995 | ............. B08B/7/02 |
| JP | 2524622 | 8/1996 | |
| JP | 2632409 | 7/1997 | |

* cited by examiner

Primary Examiner—Timothy Meeks
(74) Attorney, Agent, or Firm—Fitzpatrick, Cella, Harper & Scinto

(57) ABSTRACT

A film deposition method includes the steps of preparing a first chamber, a second chamber, and a transport connector which connects the first chamber and the second chamber with each other, setting a pressure in the second chamber to be lower than a pressure in the first chamber, and introducing a plurality of kinds of particles into the second chamber using a differential pressure between the pressure in the first chamber and the pressure in the second chamber so that the particles collide with a substrate placed in the second chamber to form a film on the substrate. The plurality of kinds of particles include particles of a sublimable substance and particles of a material for forming the film on the substrate in the second chamber. Consequently, cleaning by the sublimable substance and film deposition by the material for forming the film are performed simultaneously.

5 Claims, 3 Drawing Sheets

METHOD EMPLOYING PLURALITY OF PARTICLES AND PRESSURE DIFFERENTIALS TO DEPOSIT FILM

BACKGROUND OF THE INVENTION

1. Field of the Invention

The present invention relates to a cleaning method in the process of forming a pattern, such as a wiring pattern, on a substrate, a film deposition method, and a film deposition apparatus.

2. Description of the Related Art

Formation of films, such as wires for semiconductor and display devices, on substrates and patterning thereof are extremely important in various industries. In particular, wiring of conductive metals is widely employed in the various fields, such as for wiring on semiconductor substrates and for electrodes in display devices. Currently, in the methods which are predominantly employed, film deposition and patterning are performed separately. For example, in a conventional method, a wiring material is formed on a substrate by vapor deposition, a resist is applied over the entire surface of the vapor-deposited film, a lithographic process including exposure and development is performed to form a resist film having a predetermined shape, and patterning is performed by etching the vapor-deposited film through the resist film. In the methods using lithography, a large number of steps is generally required, resulting in an increase in cost. Moreover, many problems must be solved in such methods. For example, higher aspect ratios must be dealt with, and higher throughput must be achieved. In order to overcome the problems, methods are known in which fine particle films are formed on substrates or the like by gas deposition techniques.

The gas deposition techniques are disclosed, for example, in Japanese Patent Nos. 2524622, 1595398, and 2632409. A gas deposition technique will be described below with reference to FIG. 1. FIG. 1 is a schematic diagram showing a fine particle film deposition apparatus using the gas deposition technique.

As shown in FIG. 1, fine particles in a fine particle generation chamber 1 are introduced into a film-forming chamber 2 through a transport pipe 3 together with a gas, and the fine particles and the gas are sprayed at a high speed from a nozzle 4 provided on the end of the transport pipe 3. A fine particle film is thereby formed on a substrate 10. Vapor atoms generated from a material 8 for generating fine particles, which is a vapor source in the fine particle generation chamber 1, are rapidly cooled because they collide with an inert gas fed into the particle generation chamber 1, and are transported through the transport pipe 3 together with the inert gas while grain growth is taking place. The material vapor is generated in the fine particle generation chamber 1 by heating the vapor source with a heating mechanism 5. Any one of various known heating techniques may be used for the heating mechanism 5.

In FIG. 1, reference numeral 6 represents a vacuum pump for evacuating air from the fine particle generation chamber 1, reference numeral 7 represents a carrier gas cylinder for feeding the inert gas, and reference numeral 9 represents a substrate-moving mechanism for moving the substrate 10 in order to shift the film deposition position on the substrate 10.

As an example of formation of a wiring pattern using a gas deposition technique, Japanese Patent Laid-Open No. 05-136128 discloses a method in which circuit wiring composed of a conductive fine particle film is formed by a gas deposition technique.

Japanese Patent Laid-Open No. 07-096260 discloses a method in which cleaning is performed by spraying fine particles of a sublimable substance at a high speed. In the method, by controlling the spray intensity, cleaning and cutting can be simultaneously performed.

SUMMARY OF THE INVENTION

In general, film deposition is greatly influenced by cleaning before deposition. If cleaning is insufficient, adhesion between a substrate and a film is degraded, resulting in a decrease in durability. Furthermore, the state before deposition must be stable in order to stabilize the film deposition. Even if cleaning is performed stably, the state before deposition may become unstable due to changes with time. In order to control the state before deposition, cleaning must be performed immediately before deposition. Furthermore, although the entire surface of the substrate is usually cleaned, since some of the materials which have been provided on the substrate may be easily influenced by cleaning, cleaning of the entire surface of the substrate is not always the most suitable method. The present invention has been achieved to overcome the problems described above. It is an object of the present invention to provide a method in which film deposition and patterning are performed simultaneously using the advantage of a gas deposition technique, the film deposition is performed stably by stabilizing the state before the film deposition, and cleaning is performed selectively on necessary parts so as to avoid damage to the other parts of the substrate.

In accordance with the present invention, a film deposition method includes the steps of (A) preparing a first chamber, a second chamber, and a transport connector which connects the first chamber and the second chamber with each other, (B) setting the pressure in the second chamber lower than the pressure in the first chamber, and (C) introducing a plurality of kinds of particles into the second chamber using a differential pressure between the pressure in the first chamber and the pressure in the second chamber so that the plurality of kinds of particles collide with a substrate placed in the second chamber to form a film on the substrate. The plurality of kinds of particles include particles of a sublimable substance and particles of a material for forming the film on the substrate in the second chamber.

Preferably, the particles of the material for forming the film are preliminarily placed in the first chamber.

Preferably, the particles of the material for forming the film are generated in the first chamber.

Preferably, the sublimable substance is a substance selected from the group consisting of carbon dioxide, iodine, camphor, and naphthalene.

Preferably, the particles of the sublimable substance are fed into the transport connector located between the first chamber and the second chamber.

Preferably, one end of the transport connector is placed in the first chamber and the other end of the transport connector is placed in the second chamber, the end of the transport connector placed in the second chamber being provided with a nozzle.

Further objects, features and advantages of the present invention will become apparent from the following description of the preferred embodiments with reference to the attached drawings.

DESCRIPTION OF THE PREFERRED EMBODIMENTS

Figure 1:
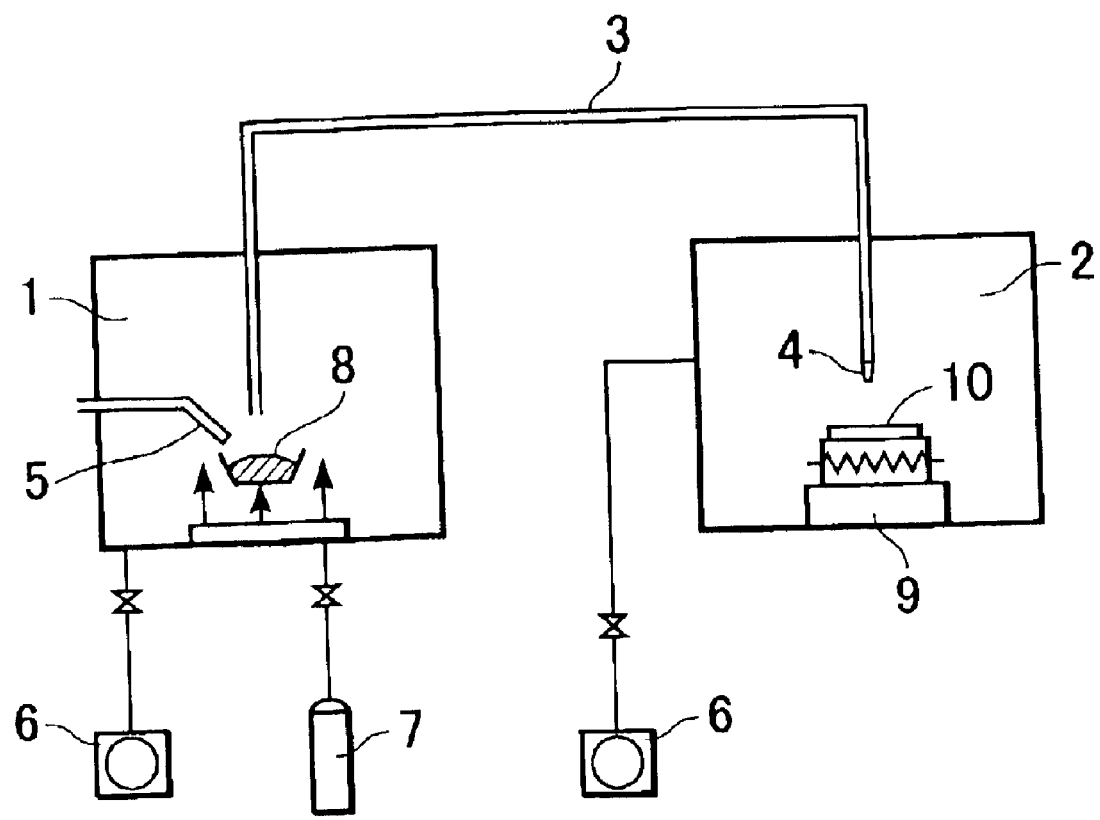
FIG. 1 is a schematic diagram of a conventional fine particle film deposition apparatus using a gas deposition technique.
Figure 2A:
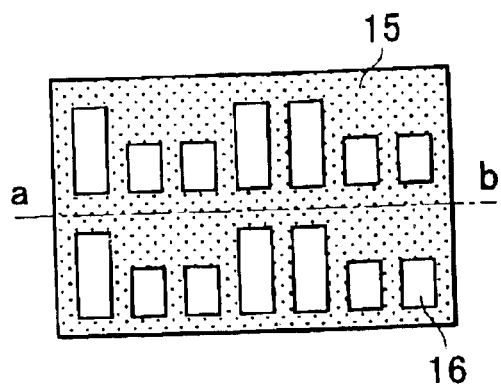
FIG. 2A is a schematic diagram illustrating a step of forming Ag wiring in accordance with the present invention.
Figure 2B:
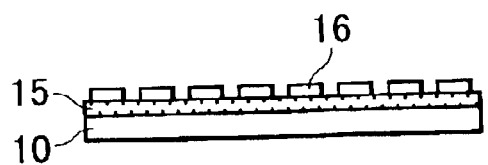
FIG. 2B is a sectional view taken along the line a-b of FIG. 2A.
Figure 3A:
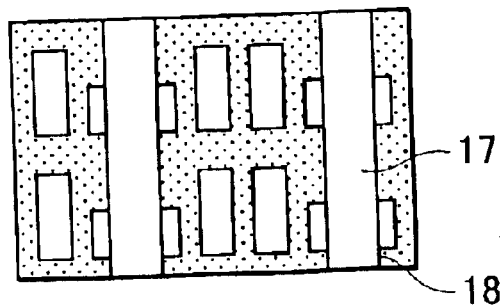
FIG. 3A is a schematic diagram illustrating a step of forming Ag wiring in accordance with the present invention.
Figure 3B:
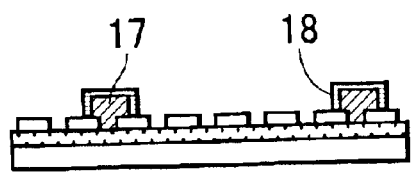
FIG. 3B is a sectional view of the state shown in FIG. 3A.

The preferred embodiments and examples of the present invention will be described in detail with reference to the drawings. It is to be understood that the invention is not limited to the sizes, materials, shapes, and relative positions of the components described in the embodiments, unless otherwise mentioned.

In a fine particle film deposition apparatus of the present invention, a material vapor generated in a fine particle generation chamber (hereinafter also referred to as "first chamber") together with a carrier gas is introduced into a film-forming chamber (hereinafter also referred to as "second chamber") through a transport connector such as a pipe using a differential pressure between the pressures in both chambers, and the material vapor is supplied through a nozzle to a substrate placed in the film-forming chamber. The materials for generating fine particles include a wiring material (metallic material) for forming wires and a sublimable material which is used for cleaning. Examples of wiring materials include Au, Ag, Cu, Pt, Al, and Ag—Cu, and examples of sublimable materials include carbon dioxide, iodine, camphor, and naphthalene.

In the film formation by a gas deposition technique, a film is deposited on a substrate mainly by dissolution of the material due to transformation of kinetic energy into thermal energy at a time when the fine particles collide with the substrate. Fine particles with a size as low as the submicron level are preferably used. In the present invention, since the wiring material must have good adhesion to the substrate, fine particles with a submicron size, which are generally considered as ultra-fine particles, are preferably used. In order to generate the fine particles, induction heating in a fine particle generation chamber as described above is usually performed. If the particle size is adjusted to a predetermined level by pulverization or the like, the material fine particles may be placed in a fine particle generation chamber and fed into a transport pipe together with a carrier gas.

The cleaning mechanism by the sublimable material will be described below. When the sublimable solid is sprayed at a high speed onto a substrate to be cleaned, kinetic energy is transformed into collision energy. Particles attached to the substrate are physically decomposed, and simultaneously, the decomposition product is removed by lift force which is generated by sublimation of the sublimable solid. In order to form the sublimable material into fine particles, any one of the various methods commonly used, such as pulverization, may be used. In order to form carbon dioxide, which is preferably used as the cleaning material, into fine particles, solidification from a liquid state by adiabatic expansion may be used, which is a method commonly used in the production of snow dry ice.

The wiring material and the sublimable material are formed into fine particles in the respective fine particle generation chambers, and the resultant fine particles are fed into a fine-particle-film-forming chamber through transport pipes together with a carrier gas. The wiring material vapor transport pipe and the sublimable material vapor transport pipe are connected on route to be merged into one transport pipe. The merged transport pipe is fed into the fine-particle-film-forming chamber, and the particles are sprayed onto the substrate through a nozzle. Depending on the materials used, heating or cooling may be required to stabilize the materials. In such materials, transportation from the transport pipe to the nozzle may be individually controlled, and deposition may be performed on the same part of the substrate.

In general, in the formation of films using a gas deposition technique, when a plurality of materials are simultaneously deposited, a film having a composition corresponding to the mixture ratio of the materials is obtained. However, in the present invention, since the sublimable material immediately vaporizes, it is inhibited from remaining as an impurity in the wiring material. The mixture ratio of the individual materials may be appropriately changed depending on the desired film shape (i.e., line width and film thickness). In order to improve the cleaning capability, which is an important effect of the present invention, the percentage of the sublimable material is preferably increased.

In order to form a pattern, the substrate and the nozzle may be moved relative to the fine-particle-film-forming chamber. To reduce possible clogging of the transport pipe with fine particles, preferably, the substrate is moved. As described above, in the film formation by the gas deposition technique, the film is deposited on a substrate mainly by dissolution of the material, and in order to improve the deposition effect, the substrate may be heated.

EXAMPLES

A fine particle film deposition method and a fine particle film deposition apparatus in accordance with the present invention will be described below with reference to FIGS. 2A, 2B, 3A, 3B, 4A, 4B, and 5. In FIG. 5, the same components as those in FIG. 1 are represented by the same reference numerals.

A substrate 10 composed of soda glass (PD200 manufactured by Asahi Glass Co., Ltd.) was cleaned with an organic solvent, and a $SiO_2$ film 15 was formed thereon. A Pt film was then formed on the substrate 10 by sputtering, and a resist layer with a predetermined pattern was formed thereon by a photolithographic process. Dry etching was performed using the resist layer as a mask, and a Pt electrode pattern 16 was thereby formed (refer to FIGS. 2A and 2B).

An Ag paste was applied onto the substrate 10 by screen printing so as to be connected to parts of the Pt electrode pattern 16, and Ag wires 17 having predetermined patterns with a thickness 10 $\mu$m were formed by exposure and development. Furthermore, an insulating paste was applied thereto by screen printing, and patterning was performed by a photolithographic process including exposure and development to form an insulating layer 18 having a predetermined shape (refer to FIGS. 3A and 3B).

Figure 4A:
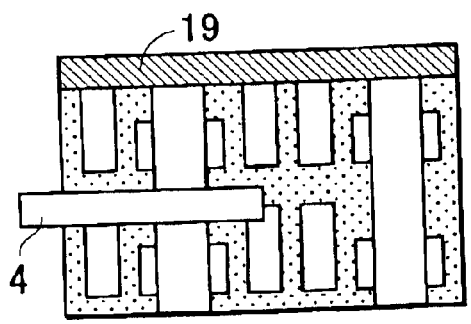
FIG. 4A is a schematic diagram illustrating a step of forming Ag wiring in accordance with the present invention.
Figure 4B:
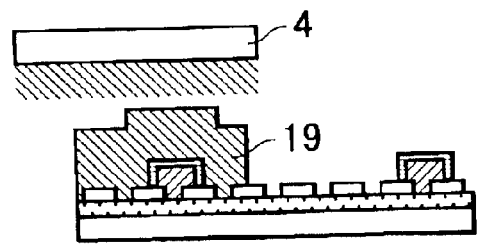
FIG. 4B is a sectional view of the state shown in FIG. 4A.
Figure 5:
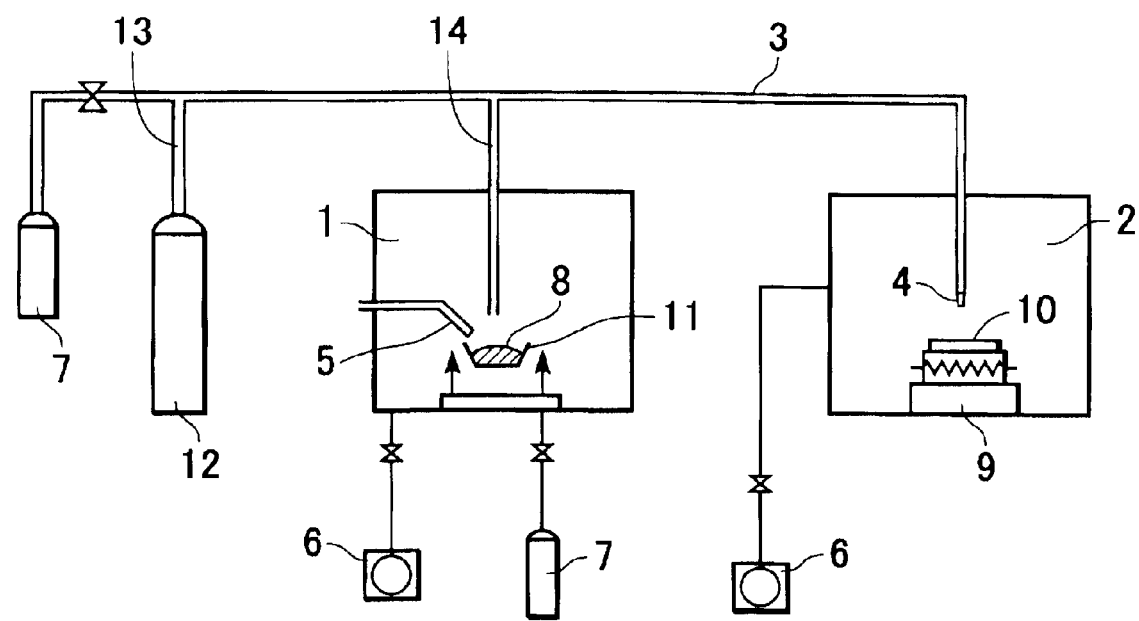
FIG. 5 is a schematic diagram of a fine particle film deposition apparatus in accordance with the present invention.

Next, using a fine particle film deposition apparatus shown in FIG. 5, an Ag pattern was formed on the substrate 10 to obtain an Ag wire 19 (refer to FIGS. 4A and 4B). At this stage, in a fine particle generation chamber 1, a crucible 11 was filled with Ag chips, and the Ag chips were melted by a RF power of 15 kW using an induction heating source. Ag fine particles (i.e., Ag vapor) were generated using an arc electrode in which four tungsten rods with a diameter of 1 mm were fixed on a ring-shaped tungsten jig at an angle of 45 degrees relative to the vertical direction toward the lower material melting section. As the cleaning material, carbon dioxide was used. Liquid carbon dioxide was encapsulated in a high-pressure cylinder 12 so that the liquid carbon dioxide was vaporized and formed into fine particles when the valve was opened. An Ag vapor transport pipe 14 and a carbon dioxide vapor transport pipe 13 were connected on route to be merged into one transport pipe 3, which was introduced into a film-forming chamber 2.

The deposition conditions were as follows.

Carrier gas: He

Nozzle used: slit opening of 0.3×5 mm

Pressure in fine particle generation chamber for film-forming material: 530 Torr Pressure in fine-particle-film-forming chamber: 1 Torr Arc current: 50 A Arc voltage: 30 V Substrate moving rate: 0.1 mm/sec Number of scanning: 2

The Ag wire thus formed had a line width of 300 $\mu$m and an average thickness of 20 $\mu$m and exhibited satisfactory adhesion. The substrate was subjected to the back-end process, such as PdO film deposition, and display characteristics were evaluated. As a result, no problem was observed.

As described above, in accordance with the present invention, by performing film deposition and cleaning simultaneously by a gas deposition technique, the fabrication process is simplified, and the state before the film deposition and the film deposition are stabilized. By cleaning only desired parts, the entire substrate is not influenced by cleaning, and materials to be used can be selected from a larger range, thus providing more freedom in the process design.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A film deposition method comprising the steps of:

(A) preparing a first chamber, a second chamber, a substrate arranged in the second chamber and a tube which connects the first chamber and the second chamber; and (B) setting a pressure in the second chamber lower than a pressure in the first chamber so that mixed particles prepared in the first chamber are introduced into the second chamber and collide with the substrate to form a film on the substrate wherein the mixed particles comprise a plurality of sublimable particles and a plurality of particles each comprising a material composing the film.

2. A film deposition method according to claim 1, further including the step of generating the plurality of particles each comprising the material composing the film in the first chamber.

3. A film deposition method according to claim 1, wherein a material composing the sublimable particles is selected from the group consisting of carbon dioxide, iodine, camphor and naphthalene.

4. A film deposition method according to claim 1, further including the step of feeding the sublimable particles into the tube located between the first chamber and the second chamber.

5. A film deposition method according to any one of claims 1 or 2–4, wherein one end of the tube is arranged in the first chamber and the other end of the tube is arranged in the second chamber, and the end of the tube placed in the second chamber includes a nozzle.

* * * * *

UNITED STATES PATENT AND TRADEMARK OFFICE
CERTIFICATE OF CORRECTION

PATENT NO.     : 6,803,075 B2
DATED          : October 12, 2004
INVENTOR(S)    : Kenichi Iwata et al.

It is certified that error appears in the above-identified patent and that said Letters Patent is hereby corrected as shown below:

<u>Column 6,</u>
Line 37, "claims 1 or 2-4," should read -- claims 1-4, --.

Signed and Sealed this

Twenty-ninth Day of March, 2005

JON W. DUDAS
*Director of the United States Patent and Trademark Office*